(12) United States Patent
Lee-Chih et al.

(10) Patent No.: US 9,256,142 B2
(45) Date of Patent: Feb. 9, 2016

(54) PELLICLE MOUNTING SYSTEM AND METHOD

(71) Applicant: Taiwn Semiconductor Manufacturing Company Ltd., Hsin-Chu (TW)

(72) Inventors: Yeh Lee-Chih, Hsinchu County (TW); Hsin-Chang Lee, Zhubei (TW); Chia-Jen Chen, Jhudong Township (TW); Anthony Yen, Zhubei (TW); Ming-Jiun Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 323 days.

(21) Appl. No.: 13/929,333

(22) Filed: Jun. 27, 2013

(65) Prior Publication Data

US 2014/0253898 A1   Sep. 11, 2014

Related U.S. Application Data

(60) Provisional application No. 61/776,329, filed on Mar. 11, 2013.

(51) Int. Cl.
*G03F 7/20* (2006.01)
*G03F 1/62* (2012.01)

(52) U.S. Cl.
CPC .............. *G03F 7/70983* (2013.01); *G03F 1/62* (2013.01)

(58) Field of Classification Search
CPC ......... G03F 1/64; G03F 7/70983; G03F 1/62; G03F 1/142; G03F 1/14; G03F 7/70866; G03F 7/70916; G03F 7/70741

USPC ............................ 355/30, 77; 430/5; 156/556
See application file for complete search history.

(56) References Cited

U.S. PATENT DOCUMENTS

| | | | | |
|---|---|---|---|---|
| 4,443,098 | A * | 4/1984 | Walwyn et al. | 355/74 |
| 4,637,713 | A * | 1/1987 | Shulenberger et al. | 355/76 |
| 5,311,250 | A * | 5/1994 | Suzuki et al. | 355/76 |
| 7,277,159 | B2 * | 10/2007 | Frye et al. | 355/75 |
| 2002/0112824 | A1 * | 8/2002 | Ballard et al. | 156/581 |
| 2004/0194556 | A1 * | 10/2004 | Shu et al. | 73/862.045 |
| 2007/0187272 | A1 * | 8/2007 | Bonness et al. | 206/455 |
| 2010/0190095 | A1 * | 7/2010 | Lin et al. | 430/5 |
| 2010/0209826 | A1 * | 8/2010 | Kim et al. | 430/5 |
| 2010/0310973 | A1 * | 12/2010 | Matsushita | 430/5 |
| 2012/0129082 | A1 * | 5/2012 | Hamada | 430/5 |

* cited by examiner

*Primary Examiner* — Steven H Whitesell Gordon
(74) *Attorney, Agent, or Firm* — Haynes and Boone, LLP

(57) ABSTRACT

A pellicle mounting method is provided. The method includes aligning a mounting apparatus with a top surface of a pellicle frame, the mounting apparatus having a continuous duct extending therethrough and a plurality of contact pins projecting from the mounting apparatus. The method also includes introducing a pressurizing fluid into the continuous duct that causes each of the plurality of contact pins to engage the top surface of the pellicle frame with a substantially equal force, a combined force of the plurality of contact pins urging a bottom surface of the pellicle frame against a top surface of a photomask, the combined force being adjustable based on a pressure within the continuous duct. Further, the method includes adjusting the pressure within the continuous duct until the pressure is approximately equal to a pre-determined optimal pressure.

20 Claims, 8 Drawing Sheets under the scaling down has also increased the complexity of processing and manufacturing ICs and, for these advances to be realized, similar developments in IC manufacturing are needed.

PELLICLE MOUNTING SYSTEM AND METHOD

CROSS-REFERENCE

This application claims the benefit of U.S. Provisional Patent Application No. 61/776,329, filed on Mar. 11, 2013, the entirety of which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, in semiconductor technologies, a plurality of photomasks (masks) are formed with predesigned IC patterns. The plurality of masks are used during lithography processes to transfer predesigned IC patterns into a plurality of exposure fields on a semiconductor wafer.

During the photolithography illumination process, the IC pattern on the photomask should be free of any foreign particles and debris. To prevent such debris from collecting on the photomask during transportation and storage, pellicles are often secured to the photomask to protect the IC pattern. A pellicle typically includes a thin film stretched across a frame that is secured to the mask by an adhesive or other semi-permanent or permanent fastener. The frame holds the film a distance above the mask pattern such that particles deposited on the film will be out of focus during illumination of the mask. In some instances, when a pellicle is mounted to a photomask, the force of pellicle frame induces distortion in the photomask. Such distortion may negatively influence the IC pattern transferred to a semiconductor wafer.

Thus, although existing approaches and structures utilized to mount a pellicle on a photomask have been satisfactory for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
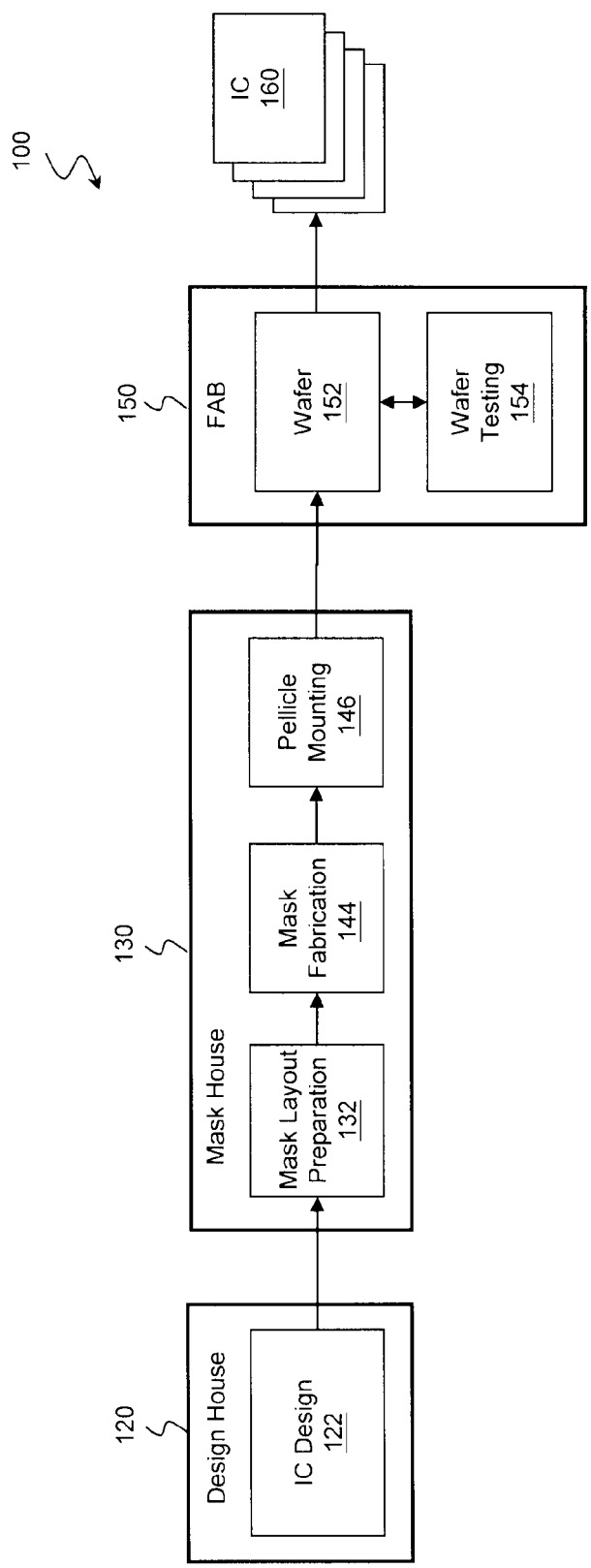
FIG. 1 is a simplified block diagram of an embodiment of an integrated circuit (IC) manufacturing system and an associated IC manufacturing flow.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask layout preparation 132, where the IC design layout 122 is translated into a form that can be physically written by a mask writer. Commonly, an IC design may be replicated multiple times on a mask such that when radiation is passed through the mask during photolithography multiple copies of the IC design (or dies) may be formed within a single exposure field (or region) of a semiconductor wafer. As an aspect of this, during mask layout preparation 132, the layout of the mask design may be determined including the location and number of dies to be formed within an exposure field, the location and width of scribe line regions (scribe lanes) around the dies, and the location and type of test structures to be formed on the wafer.

Additionally, mask layout preparation 132 may include optical proximity correction (OPC) and a lithography process check (LPC) on the IC design layout 122 to compensate for image errors and simulate mask fabrication. The mask house 130 also performs mask fabrication 144, where the design layout prepared by the mask layout preparation 132 is modified to comply with a particular mask writer and/or mask manufacturer and is then fabricated. In the present embodiment, the mask layout preparation 132 and mask fabrication 144 are illustrated as separate elements, however, the mask layout preparation 132 and mask fabrication 144 can be collectively referred to as mask data preparation.

During mask fabrication 144, a mask or group of masks are fabricated based on the mask design layout which incorporates one or more copies of the IC design layout 122 as modified by mask layout preparation 132. For example, an electron-beam (e-beam) or a mechanism of multiple e-beams is used to form a pattern on a mask (photomask or reticle) based on the mask design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

After a mask has been fabricated, the mask house performs a mask inspection to determine if the fabricated mask includes any defects, such as full-height and non-full-height defects. If any defects are detected, the mask may be cleaned or the mask design layout and/or IC design may be modified further depending on the types of defects detected.

If a mask passes inspection, it undergoes a pellicle mounting process 146. Specifically, during the pellicle mounting 146, a pellicle is secured to the mask to prevent particles from falling onto the mask pattern and causing defects during subsequent lithography processes. A pellicle typically includes a thin film stretched across a frame that is secured to the mask by an adhesive or other semi-permanent or permanent fastener. The frame holds the film a distance above the mask pattern such that particles deposited on the film will be out of focus during illumination of the mask. Structures and methods to mount a pellicle to a mask are described in more detail in association with FIGS. 3-8.

It should be understood that the above description of the mask layout preparation 132 has been simplified for the purposes of clarity, and layout preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during mask fabrication 144 and mask inspection may be executed in a variety of different orders and may include a variety of different and/or additional steps.

The IC manufacturer 150, such as a semiconductor foundry, uses the mask (or masks) fabricated by the mask house 130 to fabricate a semiconductor wafer 152 having a plurality of the IC devices 160 thereon. The IC manufacturer 150 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, the semiconductor wafer 152 is fabricated using the mask (or masks) to form a plurality of the IC devices 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes. Further, during a photolithography process, light is passed though the mask (and pellicle) so as to transfer the pattern on the mask to the semiconductor wafer.

After a semiconductor wafer 152 has been fabricated it may be subjected to wafer testing 154 to ensure the integrated circuits formed thereon conform to physical manufacturing specifications and electrical performance specifications. Commonly, test structures (or process control monitors) formed on the wafer during lithography may be utilized to generate test data indicative of the quality of the fabricated semiconductor wafer. After the wafer 152 passes wafer testing 154, it may be diced (or sliced) along scribe lines to separate the IC devices 160 formed thereon. The dicing process can be accomplished by scribing and breaking, by mechanical sawing (e.g., with a dicing saw) or by laser cutting. Following the dicing process, the plurality of IC devises 160 are individually packaged for use in building electronic devices and, in some embodiments, may be subjected to further individual testing.

Figure 2:
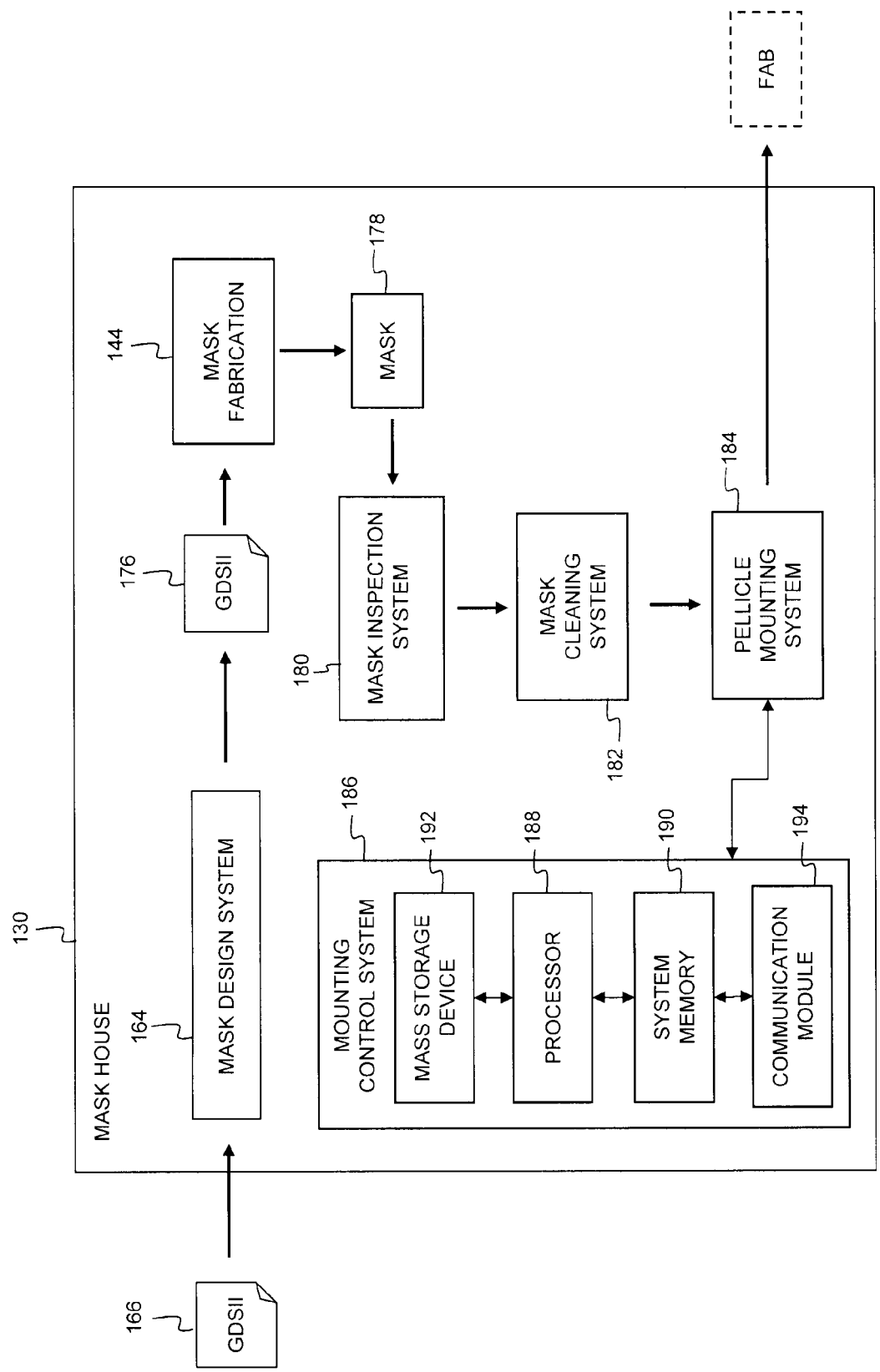
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes various systems that perform the functionality described in association with mask layout preparation 132, mask fabrication 144, mask inspection, and pellicle mounting 146 of FIG. 1.

In more detail, the mask house 130 includes a mask design system 164 that is generally configured to produce a mask layout design based on the IC design layout 122 from the design house 120. In the illustrated embodiment, the mask design system 164 is an information handling system such as a computer, server, workstation, handheld computing device, or other suitable computing device or collection of communicatively coupled computing devices.

In more detail, the mask design system 164 accepts as input a first GDSII file 166 containing the IC design layout 122 from the design house 120. The mask design system 164 is configured to produce a mask design layout that includes all of the features to the formed in an exposure field on a semiconductor wafer. For example, the mask design system is configured to determine the number and arrangement of dies to be formed within an exposure field, the location and width of scribe line regions (scribe lanes) interposed between the dies, and the arrangement and type of test structures to be formed on the wafer. In one embodiment, wafer testing requirements may be input into the wafer design system that determine, in part, the type and placement of any test structures necessary to gather required wafer evaluation data.

After the mask design system 164 has formed an appropriate mask design layout, the mask design system transmits a second GDSII file 176 containing the mask design layout to mask fabrication 144. In alternative embodiments, the mask design layout may be transmitted between the components in IC manufacturing system 100 in alternate file formats such as DFII, CIF, OASIS, or any other suitable file type. Mask fabrication 144 produces a mask 178.

The mask house 130 further includes a mask inspection system 180 that is operable to inspect the mask 178 for structural defects. That is, the mask inspection system 180 determines whether the mask 178 conforms to the mask design layout created by the mask design system 164. In various embodiments, the mask inspection system 180 may include an imaging system to scan photomasks at multiple resolutions and produce mask images at the multiple resolutions for inspection. For example, the mask inspection tool 180 may include additional imaging tools such as an optical inspection tool, an electron-beam (e-beam) inspection tool, a scanning probe microscope system, a laser microscope system, a transmission electron microscope system, a focus ion beam microscope system, or other suitable imaging tools. Additionally, the mask inspection system 180 may be configured to identify and classify a variety of defects on the surface of mask 178 as captured in the images produced by the imaging systems. Depending on the types of defects identified by the mask inspection system 180, the mask 178 may be sent to a mask cleaning system 182 before it is transported to the fab 150, or the mask may be discarded and the defect information may be relayed to the mask design system 164 so that the mask design layout and/or IC design layout may be adjusted.

After the mask 178 has been cleaned, a pellicle mounting system 184 mounts a pellicle onto the mask 178 to protect the mask pattern from particles and other debris during transport to the fab and during the patterning of semiconductor wafers. As will be described in FIGS. 3-8, the pellicle mounting system 184 includes hardware and software components to secure a pellicle frame to a mask without introducing distortion to the mask or introducing only a negligible amount of distortion. As shown in FIG. 2, the pellicle mounting system 184 includes a mounting control system 186 that is configured to, among other things, control the force used to secure the pellicle frame to the mask 178. In the illustrated embodiment, the mounting control system 186 is an information handling system such as a computer, server, workstation, handheld computing device, or other suitable computing device or collection of communicatively coupled computing devices. The mounting control system 186 includes a processor 188 that is communicatively coupled to a system memory 190, a mass storage device 192, and a communication module 194. The system memory 190 provides the processor 188 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 192. Examples of mass storage devices may include hard discs, optical disks, magneto-optical discs, solid-state storage devices, and/or a variety other mass storage devices known in the art. The communication module 194 is operable to receive data such as IC design layout data from local and remote networked systems and communicate information such as finalized mask design data to the other components in the mask house 130. Examples of communication modules may include Ethernet cards, 802.11 WiFi devices, cellular data radios, and/or other suitable devices known in the art.

It is understood that the mask house 130 has been simplified for the sake of clarity and the mask design system 164, the pellicle mounting system 184, the mounting control system 186, and the mask house itself may include additional and/or different components in alternative embodiments.

Figure 3:
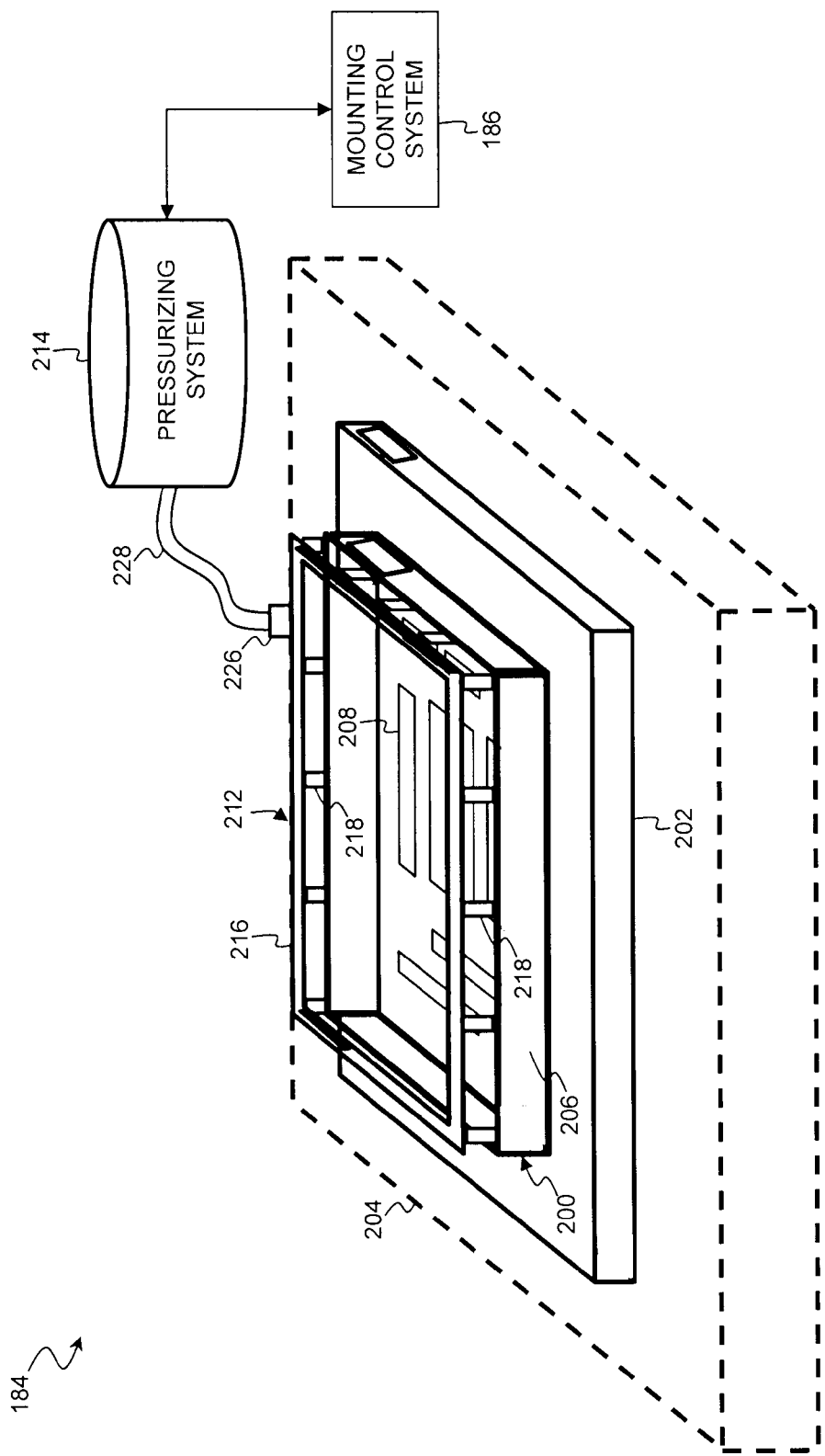
FIG. 3 is a diagrammatic perspective view of the pellicle mounting system of FIG. 2 according to various aspects of the present disclosure.
Figure 4:
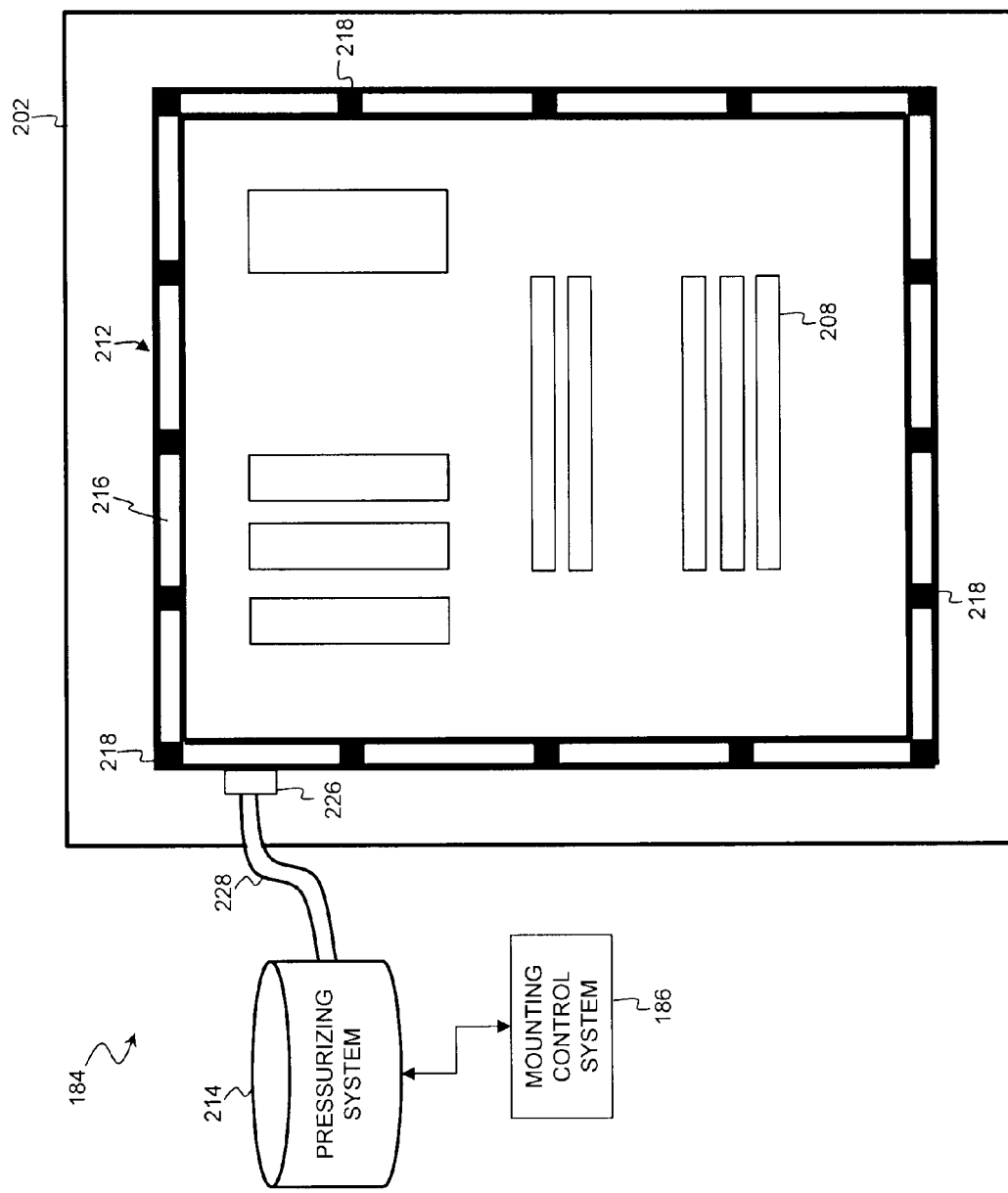
FIG. 4 is a diagrammatic top view of the pellicle mounting system of FIG. 2 according to various aspects of the present disclosure.
Figure 5:
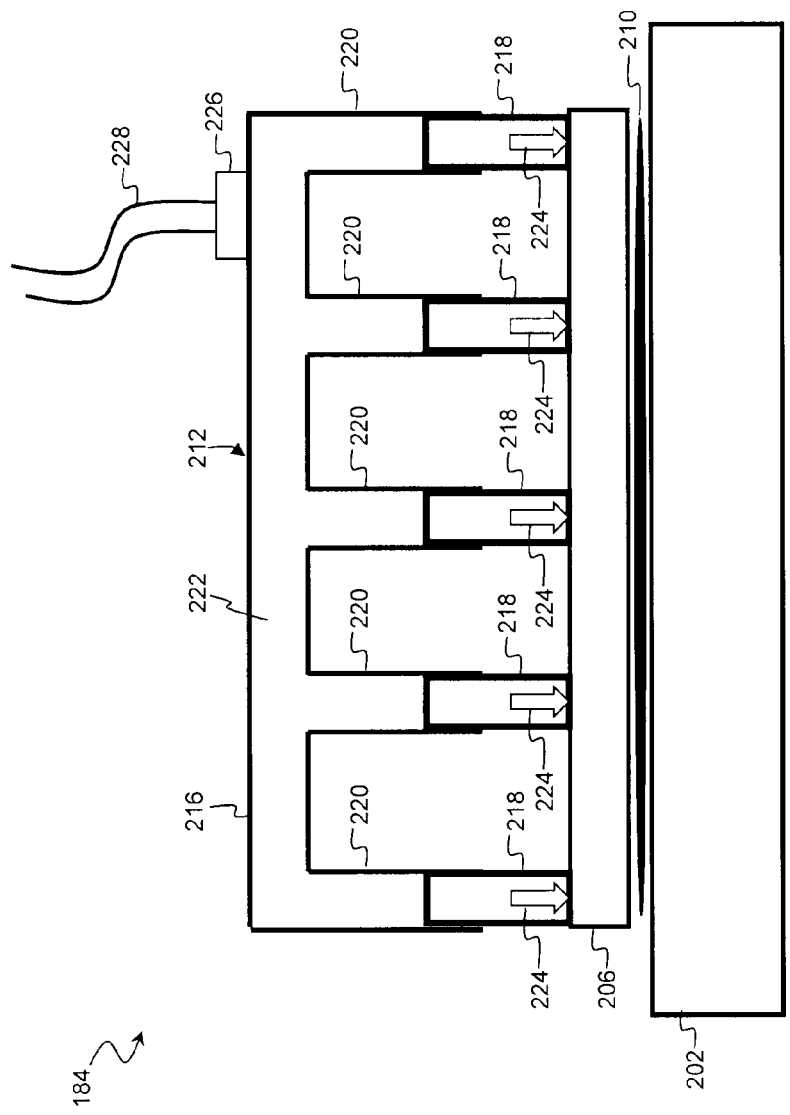
FIG. 5 is a sectional side view of the pellicle mounting system of FIG. 2 according to various aspects of the present disclosure.

Referring now to FIGS. 3, 4, and 5 illustrated are various diagrammatic views of the pellicle mounting system 184 according to aspects to the present disclosure. In particular, FIG. 3 is a diagrammatic perspective view of the pellicle mounting system 184, FIG. 4 is a diagrammatic top view of the pellicle mounting system, and FIG. 5 is a sectional side view of the pellicle mounting system. In the illustrated embodiment of FIGS. 3-5, the pellicle mounting system 184 is generally configured to mount a pellicle 200 to a photomask 202. During the mounting process, the photomask (and/or pellicle) may be releasably secured to a table 204 or other holding mechanism (not illustrated in FIGS. 4 and 5) such that it is stationary during mounting. The pellicle includes a pellicle frame 206 with a thin, transparent film (not shown) stretched over its upper opening. The film protects a mask pattern 208 disposed on the photomask 202. In certain embodiments the pellicle frame 206 is constructed of anodized aluminum and holds the thin film approximately 5-10 mm above the mask pattern 208. However, in other embodiments the pellicle frame may be constructed with a different material and hold the thin film a different height above the mask pattern 208. For instance, in certain embodiments, the pellicle frame 206 has a height that is the approximately the same as a thickness of the photomask 202. Further, in the illustrated embodiment, the pellicle frame 206 is a square or rectangle shape, but, in alternative embodiments, the pellicle frame may be other shapes. As shown in FIG. 5, an adhesive 210 is disposed between a bottom surface of the pellicle frame 206 and a top surface of the photomask 202. The adhesive 210 may be any type commonly utilized in photolithography applications and may be permanent, semi-permanent, or not permanent once cured. During the pellicle mounting process, the bottom surface of the pellicle frame 206 is pressed against the top surface of the photomask 202 and the adhesive 210 secures the two together.

In that regard, to facilitate the pellicle mounting process, the pellicle mounting system 184 includes a mounting apparatus 212, a pressurizing system 214, and the mounting control system 186. The mounting apparatus 212 is configured to exert force on the pellicle frame 206 so that it may be secured to the photomask 202. In greater detail, the mounting apparatus 212 includes a body portion 216 that may be similar in shape to the pellicle frame 206 when viewed from a top perspective, as shown in FIG. 4. In other embodiments, the shape of the body portion 216 of the mounting apparatus 212 is independent from the shape of the pellicle frame and/or photomask and thus may be various other shapes. For example, the body portion 216 may cover the entirety of the upper opening of the pellicle rather than extend only around its perimeter. The body portion 216 of the mounting apparatus 212 includes a plurality of contact pins 218 that extend from a bottom surface of the body portion and are configured to engage the top surface of the pellicle frame 206. During the pellicle mounting process, the plurality of contact pins 218 exert force on the pellicle frame 206 to urge it against the top surface of the photomask 202. In the illustrated embodiment, the plurality of contact pins 218 are disposed along the body portion 216 in a pattern that traces the outline of the pellicle frame 206. In certain embodiments, the plurality of contact pins 218 are equidistant from each other so that the force exerted by the contact pins is distributed evenly around the pellicle frame 206. In alternative embodiments, the plurality of contact pins 218 may be distributed in a different manner. Further, although the contact pins 218 are shown as having vertical movement, the photomask 202, pellicle frame 206, and mounting apparatus 212 may be oriented such that the contact pins have horizontal movement or movement at in a different direction.

In the sectional side view of FIG. 5, the mounting apparatus 212, including the plurality of contact pins 218, is shown in more detail. In that regard, the mounting apparatus 212 includes a plurality of projections 220 in which the plurality of contact pins 218 are disposed. Specifically, the contact pins 218 are retractably coupled within the projections 220 so that each contact pin may extend from or retract into a projection a variable amount, for example, to conform to the top surface of the pellicle frame 206. Further, the mounting apparatus 212 includes a continuous duct 222 disposed throughout the body portion 216 and the plurality of projections 220. The continuous duct 222 is sealed such that it may be pressurized by the introduction of fluids within it. In certain embodiments, the fluid within the duct 222 may be a gas such as clean, dry air, or, in alternative embodiments, the fluid may be a liquid such as a hydraulic fluid. In that regard, the amount of pressurizing fluid introduced into the continuous duct 222 (i.e., the pressure within the continuous duct) influences the force with which the plurality of contact pins 218 extend from the mounting apparatus 212. During a pellicle mounting process, pressurizing fluid is introduced into the continuous duct 222, the plurality of contact pins 218, in response, exert a combined force on the top surface of the pellicle frame 206, and the bottom surface of the pellicle frame is urged against the top surface of the photomask 202 so that it may be secured thereto by the adhesive 210.

Notably, because the duct 222 is continuous the unified pressure within the duct exerts a substantially equal force on each contact pin 218. As such, when the plurality of contact pins 218 are engaged with the top surface of the pellicle frame 206 and pressurizing fluid is introduced into the duct 222, each pin exerts a substantially equal force 224 on the pellicle frame. As such, the likelihood of pellicle-induced distortion of the photomask 202 is reduced because all portions of the bottom surface of the pellicle frame 206 would, in turn, exert substantially the same force on the top surface of the photomask. One of ordinary skill in the art would recognize that the sectional side view shown in FIG. 5 has been simplified for the sake of clarity and the mounting apparatus 212 may include additional standard mechanical elements to facilitate the operation of the plurality of contact pins 218.

The mounting apparatus 212 further includes a main inlet 226 disposed on the outside of the body portion 216 through which pressurizing fluid may be introduced into the continuous duct 222. The main inlet 226 is coupled to the pressurizing system 214 via a conduit 228. In certain embodiments, the pressurizing system 214 is a standard pneumatic, hydraulic, or other pressurizing system known in the art. The pressurizing system 214 includes a reservoir of pressurizing fluid and controls the flow of pressurizing fluid through the conduit 228 and into the continuous duct 222 of the mounting apparatus 212. In that regard, the pressurizing system 214 may increase and decrease the amount of fluid within the continuous duct 222 (thereby increasing and decreasing the pressure within the continuous duct) to respectively increase and decrease the force 224 exerted by the plurality of contact pins 218. The mounting control system 186, in turn, electronically controls the pressurizing system 214. In the illustrated embodiment, the mounting control system 186 may programmatically control the amount of force exerted by the mounting apparatus 212 on the pellicle frame 206 (via the pressurizing system 214) so that the pellicle 200 is appropriately secured to the photomask 202 with little or no pellicle-induced distortion. For instance, in one embodiment, the mounting control system 186 may adjust the pressure within the continuous duct 222 so that it equals a pre-determined optimal pressure that is known to cause the contact pins 218 to exert an optimal mounting force on the pellicle frame 206. The optimal mounting force may be the force that is strong enough for the adhesive to adequately secure the pellicle frame to the photomask but weak enough that it does not cause the pellicle frame to distort the photomask. The mounting control system 186 may include hardware and/or software-implemented control algorithms to precisely control the amount of pressure within the continuous duct 222.

Figure 6:
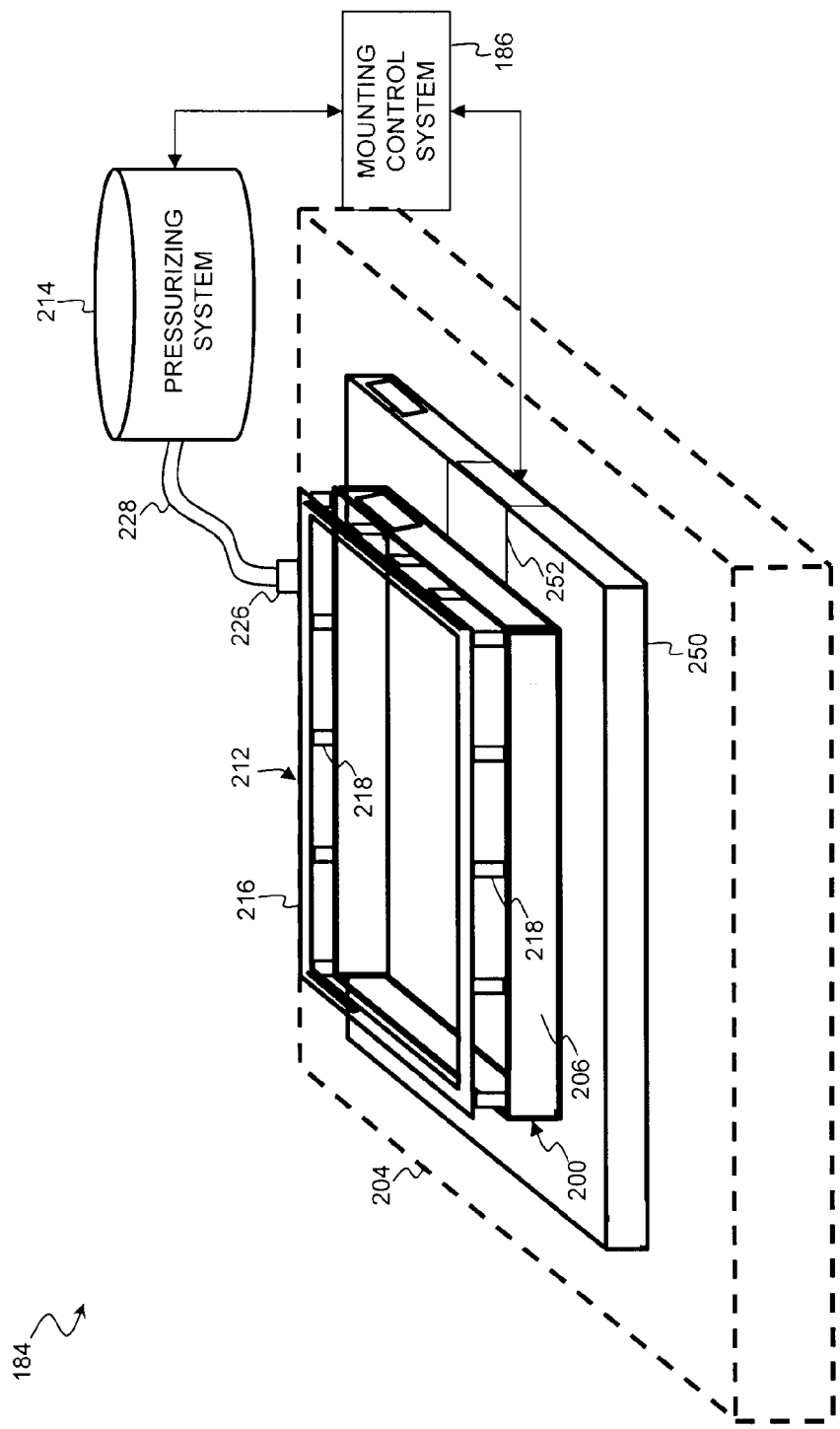
FIG. 6 is a diagrammatic perspective view of a monitor photomask being utilized with the pellicle mounting system to determine an optimal pressure for pellicle mounting.

In that regard, in one embodiment, a pre-determined optimal pressure within the continuous duct that produces an optimal mounting force for a pellicle frame may be obtained by utilizing a monitor photomask having sensors therein before mounting the pellicle to a production photomask. FIG. 6 illustrates a monitor photomask 250 being utilized in conjunction with the pellicle mounting system 184 to determine an optimal pressure. The monitor photomask 250 may be of the same dimensions and constructed of the same material as a production photomask (such as photomask 200), but may include internal and/or external pressure sensors 252 configured to detect a force imposed upon a top side of the monitor photomask by the pellicle frame 206. In other embodiments, the monitor photomask 250 may have other dimensions and be constructed of material different than that of a production photomask. The sensors 252 communicate pressure data to the mounting control system 186. The mounting control system 186 may, in turn, utilize the pressure data to adjust the amount of pressure within the continuous duct 222. As described in described in greater detail in association with FIG. 8, this feedback loop may be utilized to determine the optimal pressure within the continuous duct 222 to use when mounting a pellicle to a production photomask. Accordingly, pellicle mounting methods and associated algorithms are described in greater detail in association with FIG. 8

One of ordinary skill in the art would recognize that the pellicle mounting system 184 described in association with FIGS. 3-5 is simply an example embodiment and alternative embodiments may include additional and/or different elements. Further, the mounting apparatus 212 and the pressurizing system 214 themselves may include additional and/or different features in alternative embodiments. For instance, the mounting apparatus 212 may include a different number of contact pins or may rely on something other than contact pins to exert force on the pellicle frame 2061. For example, the mounting apparatus 212 may utilize a retractable bar that extends continually from the base of the body portion 216, or the mounting apparatus 212 may utilize air pressure alone to force the pellicle frame against the photomask. However, in the illustrated and alternative embodiments of the pellicle mounting system 184, the mounting apparatus 212 is configured to exert a uniform force on the top surface of the pellicle frame so as to reduce the likelihood of pellicle-induced distortion in the photomask. Further, in some embodiments, the mounting apparatus 212 may exert pressure on the backside photomask such that it is pressed against a pellicle frame that is held stationary.

Figure 7:
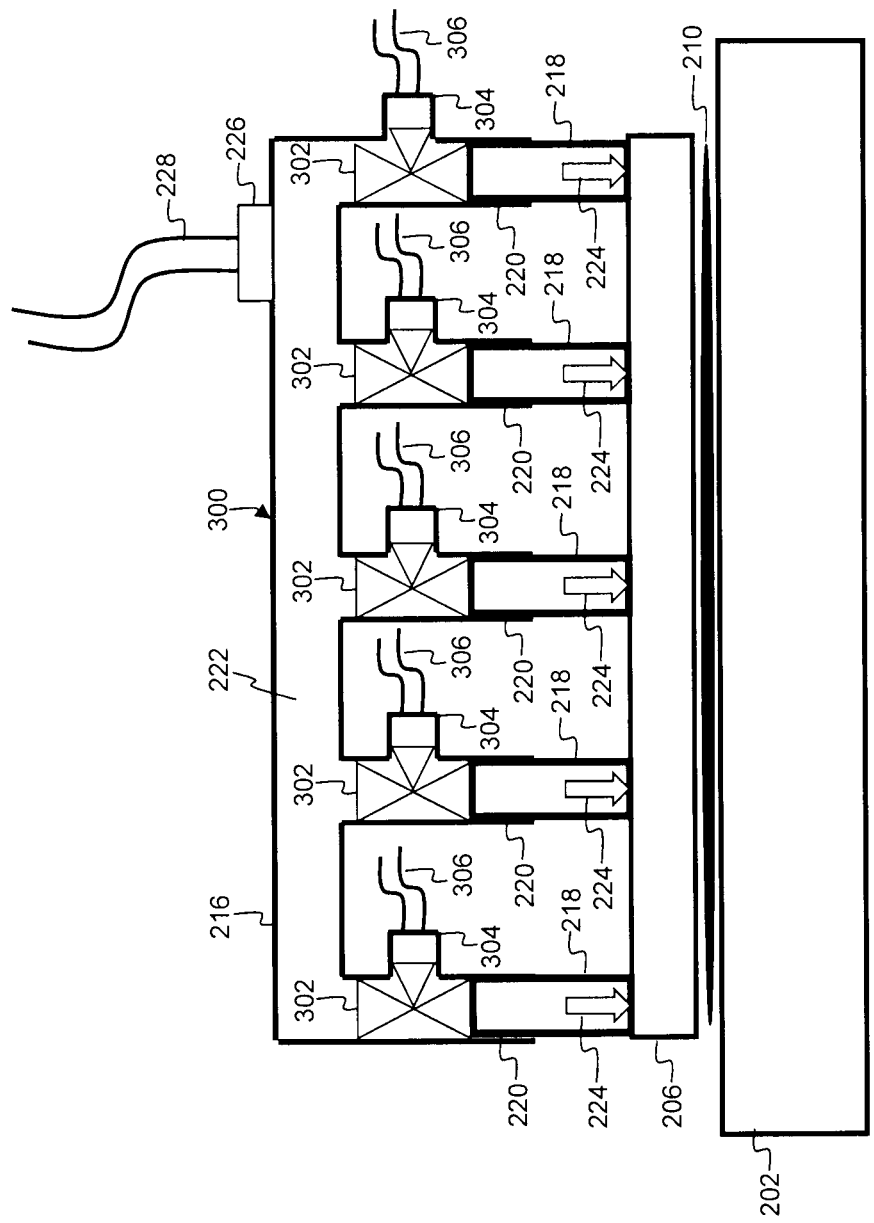
FIG. 7 is a sectional side view of a mounting apparatus according to a further embodiment of the present disclosure.

Referring now to FIG. 7, illustrated is a sectional side view of a mounting apparatus 300 according to a further embodiment of the present disclosure. The mounting apparatus 300 is similar to the mounting apparatus 212 in the pellicle mounting system 184 illustrated in FIGS. 3-5. However, the mounting apparatus 300 additionally facilitates discrete control of the force exerted by each contact pin. Elements of the mounting apparatus 300 similar to elements of the mounting apparatus 212 are numbered similarly.

Similar to the mounting apparatus 212, the mounting apparatus 300 includes a body portion 216, projections 220, a plurality of contact pins 218, and a continuous duct 222 disposed within the body portion and projections. The mounting apparatus 300, however, further includes a plurality of valves 302 respectively disposed within the plurality of projections 220. Further, each valve 302 has associated with it a contact pin inlet 304 that is configured to independently receive pressurizing fluid from the pressurizing system 214 via one of a plurality of conduits 306. In general, the plurality of valves 302 are configured to facilitate discrete control of the force exerted by each contact pin 218.

In more detail, each valve 302 controls the amount of pressure exerted on an adjacent contact pin 218 by regulating the amount of pressurizing fluid from the continuous duct 222 that impacts the contact pin and also the amount of pressurizing fluid from the adjacent contact pin inlet 304 that impacts the contact pin. In certain embodiments, each valve 302 includes a first variable-sized aperture that can be adjusted to permit a variable amount of pressurizing fluid from the continuous duct 222 to influence an associated contact pin 218, and each valve also includes a second variable-sized aperture that can be adjusted to permit a variable amount of pressurizing fluid from an adjacent contact pin inlet 304 to influence the associated contact pin. In this manner, the amount of pressure exerted on each contact pin 218 and, in turn, the amount of force exerted by each contact pin on the pellicle frame 208 may be adjusted. For example, if it determined that the amount of force exerted by a specific contact pin on the pellicle frame 206 is insufficient when the contact pin is only influenced by the pressurizing fluid in the continuous duct 222, the valve 302 associated with the specific contact pin may be adjusted so an additional amount of pressurizing fluid from the associated contact pin inlet 304 influences the specific contact pin and the force exerted by the contact pin is increased. In alternative embodiments, each valve 302 may be configured to permit only pressurizing fluid from one or the other, but not both, of the continuous duct 222 and a contact pin inlet 304 to influence a contact pin 218 at a time. In one embodiment, the mounting control system 186 is configured to individually adjust the plurality of valves 302 to individually fine-tune the force exerted by the plurality of contact pins 218. In such an embodiment, the mounting control system 186 may include hardware and/or software-implemented control algorithms to precisely control the force exerted by each of the plurality of contact pins 218.

One of ordinary skill in the art would recognize that the mounting apparatus 300 illustrated in FIG. 7 is simply an example embodiment and alternative embodiments may include additional and/or different elements. For example, in certain embodiments, the mounting apparatus 300 may include pressure sensors disposed within each projection 220 to individually monitor the pressure influencing each contact pin. Pressure data collected by such sensors may be communicated to the mounting control system 186 in a feedback loop to facilitate intelligent control of the valves 302. In some instances, force-sensing modules within each projection may monitor the force exerted by each contact pin on the pellicle frame. In such an embodiment, the force-sensing modules may also set the force exerted by each contact pin on the pellicle frame.

Figure 8:
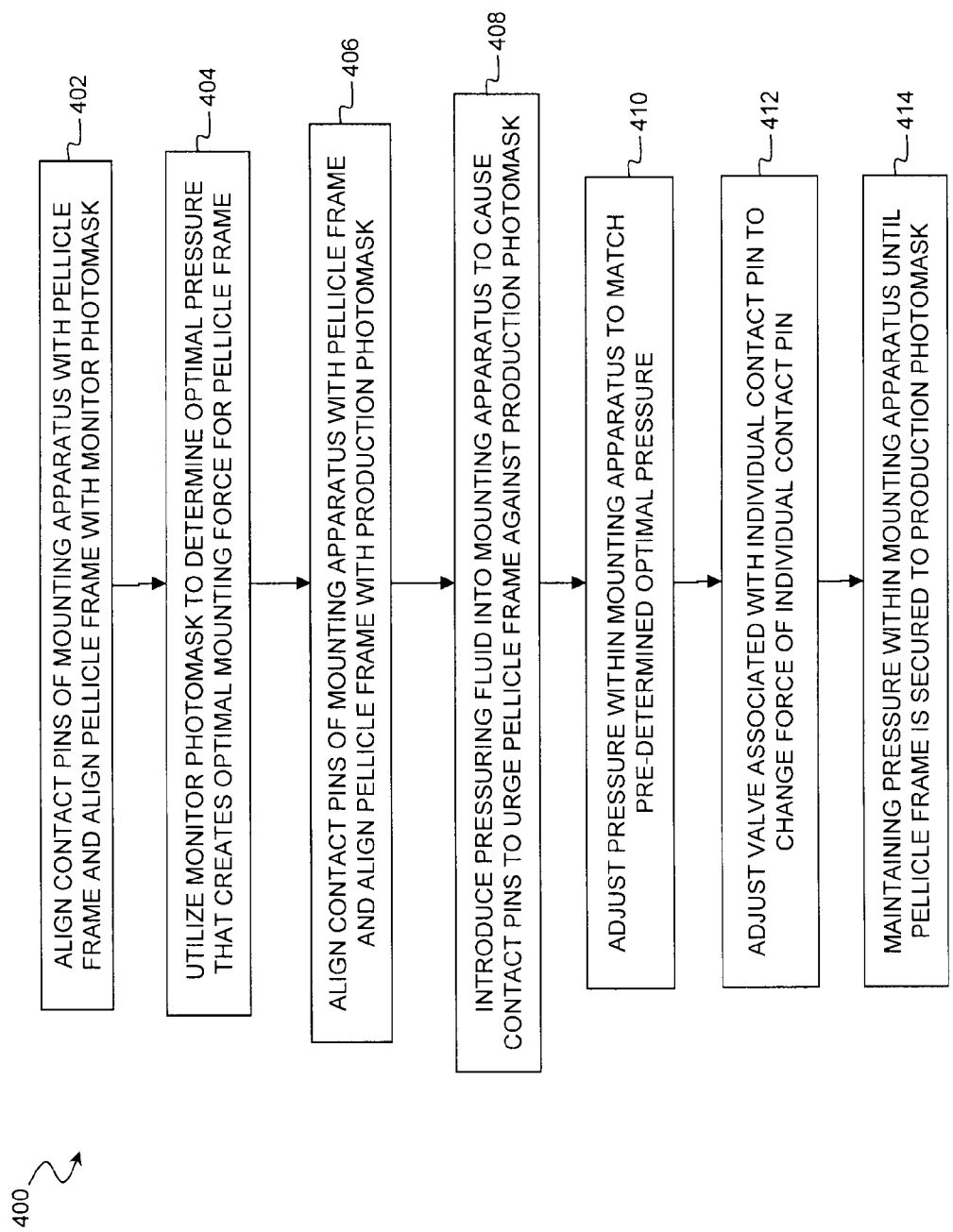
FIG. 8 is a high-level flowchart of a method of mounting a pellicle to a photomask according to various aspects of the present disclosure.

Referring now to FIG. 8, illustrated is a high-level flowchart of a method 400 of mounting a pellicle to a photomask according to various aspects of the present disclosure. In the illustrated embodiment, the method 400 is carried out by portions of the integrated circuit (IC) manufacturing system 100 including the pellicle mounting system 184 in the mask house 130 shown in FIGS. 1 and 2. Further, in one embodiment, portions of the method 400 may be implemented as computer-readable instructions stored on the mass storage device 192 or system memory 190 and executed by the processor 188 of the mounting control system 186. In general, the method 400 mounts a pellicle frame to a photomask in a manner that reduces the amount of photomask distortion induced by the pellicle frame.

The method 400 begins at block 402 where the plurality of contact pins 218 on the mounting apparatus 212 (or mounting apparatus 300) are aligned with and engage the top surface of the pellicle frame 206. The pellicle frame 206 is, in turn, aligned with the monitor photomask 250 (as shown in FIG. 6). Specifically, a bottom surface of the pellicle frame 206 may be flush against a top surface of the monitor photomask 250. Next, in block 404, the monitor photomask 250 is used in conjunction with the mounting control system 186 to determine an optimal pressure within the continuous duct 222 that causes the contact pins 218 to urge the bottom surface of the pellicle frame 206 against top surface of the monitor photomask 250 with an optimal mounting force. In certain embodiments, the optimal mounting force for the pellicle 200 is a known variable and in block 404 it is determined what pressure within continuous duct 222 causes that optimal mounting force. In that regard, the mounting control system 186 commands the pressurizing system 214 to introduce pressurizing fluid into the continuous duct to cause the plurality of contact pins to engage the top surface of the pellicle frame 206 and urge the pellicle frame into the monitor photomask 250. The pressure sensor 252 detects the force with which the pellicle frame 206 is urged into the monitor photomask and relays the force data to the mounting control system 186. The mounting control system 186 then adjusts the pressure within continuous duct 222 via the pressurizing system 214 so that the force with which the pellicle frame 206 is urged into the monitor photomask 250 is roughly equivalent to the optimal mounting force. When an optimal mounting force has been reached the current pressure within the continuous duct 222 is recorded and determined to be the optimal pressure for use during pellicle mounting on a production photomask.

In alternative embodiments in which the mounting apparatus 300 (FIG. 7), is utilized to mount a pellicle frame to a photomask, an optimal pressure within the continuous duct 222 may be first determined and then any individual pressure adjustments associated with each individual contact pin 218 may be determined. For instance, the mounting control system 186 may adjust the valve 302 associated with each contact pin 218 to fine-tune the force exerted by each contact pin such that the pellicle frame is mounted without distorting the monitor photomask or only distorting the photomask a negligible amount. These individual valve adjustments may be recorded so that they can be applied during the pellicle mounting for the production photomask.

After the optimal pressure for mounting a pellicle frame is determined in block 404, the method 400 continues to block 406 where the where the plurality of contact pins 218 on the mounting apparatus 212 (or mounting apparatus 300) are aligned with and engage the top surface of the pellicle frame 206. The pellicle frame 206 is, in turn, aligned with the production photomask 202 (as shown in FIGS. 3-5). Specifically, a bottom surface of the pellicle frame 206 may be flush against a top surface of the production photomask 202. Next, in block 408, the mounting control system 186 commands the pressurizing system 214 to introduce pressurizing fluid into the continuous duct 222 to cause the plurality of contact pins to engage the top surface of the pellicle frame 206 and urge the pellicle frame into the production photomask 202. The method 400 then proceeds to block 410 where the mounting control system 186 adjusts the pressure within continuous duct 222 via the pressurizing system 214 so that the pressure within the continuous duct is approximately equal to the pre-determined optimal pressure determined in block 404. When the pressure within continuous duct is approximately equal to the pre-determined optimal pressure, the force with which the pellicle frame is urged against the photomask should be approximately equal to the optimal mounting force.

In the illustrated embodiment, the production photomask 202 does not include a pressure sensor to detect the force with which the pellicle frame is urged into it. However, in alternative embodiments, the production photomask may have internal or external pressure sensors that monitor mounting forces and relay the data to the mounting control system 186. In such a scenario, pre-determining an optimal pressure within the continuous duct 222 in blocks 402 and 404 may be unnecessary, as the pressure within the continuous duct 222 may be adjusted in real time during the production pellicle mounting process so that it creates the optimal mounting force, as detected by the sensors.

After the pellicle frame 206 has been urged against the photomask with the optimal mounting force, the method 400 continues to block 412 in embodiments utilizing the mounting apparatus 300 having individually adjustable contact pins. In more detail, in optional block 412, the mounting control system 186 may adjust the valves 302 associated with one or more selected contact pins 218 to fine-tune the force exerted by the selected contact pins on the pellicle frame 206. The mounting control system 186 may adjust the valves 302 according to the valve adjustment values optionally recorded in block 404. This optional step may be desired when the pellicle frame is an abnormal shape, for example, when the bottom surface of the pellicle frame is not entirely flush with the top surface of the photomask.

Finally, in block 414, when the pressure within the continuous duct 222 has been sufficiently adjusted so that the pellicle frame 206 is urged against the photomask with a sufficient force, the pressure may be maintained until the pellicle frame is adequately secured to the production photomask with the adhesive 210. For instance, the pressure may be maintained until the adhesive 210 has cured or set a sufficient amount so that the bond between the pellicle frame and the photomask will hold when the contact pins 218 stop exerting force on the pellicle frame. In this manner, the pellicle 200 is mounted to the photomask 202 and only a negligible amount of distortion or no distortion is induced in the photomask. In some instances, method 400 is operable to limit pellicle-induced distortion to below 3% of the photomask width. In other instances, method 400 is operable to limit pellicle-induced distortion to below 1% of the photomask width. In other instances, method 400 is operable to limit pellicle-induced distortion to below 0.5% of the photomask width.

It is understood that the method 400 of mounting a pellicle to a photomask is simply an example embodiment, and in alternative embodiments, additional and/or different steps may be included in the method. For example, in block 404, rather than determining a single optimal pressure within the continuous duct of the mounting apparatus, an optimal contact pin pressure may be determined for each respective contact pin. The optimal contact pin pressure for an individual pin may be controlled by the associated valve and may include a pressure component contributed by the continuous duct and a pressure component contributed by an associated contact pin inlet. In such an embodiment, force and/or distortion may be monitored at each location on the monitor photomask 250 that is engaged by a contact pin to determine the plurality of individual contact pin pressures. The plurality of contact pin pressures may be recorded and utilized in blocks 410 and 412 to create the optimal mounting force between the pellicle frame and the production photomask.

Further, portions of the method 400 of mounting a pellicle to a photomask in the illustrated embodiments are designed to be executed on any computing architecture, such as the systems described in association with mask house 130 of FIG. 2. For example, portions of the method 400 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CD-ROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to pellicle mounting method. The method includes aligning a mounting apparatus with a top surface of a pellicle frame, the mounting apparatus having a continuous duct extending therethrough and a plurality of contact pins projecting from the mounting apparatus and engaging the top surface of the pellicle frame. The method also includes introducing a pressurizing fluid into the continuous duct that causes each of the plurality of contact pins to engage the top surface of the pellicle frame with a substantially equal force, a combined force of the plurality of contact pins urging a bottom surface of the pellicle frame against a top surface of a photomask, the combined force being adjustable based on a pressure within the continuous duct. Further, the method includes adjusting the pressure within the continuous duct until the pressure is approximately equal to a pre-determined optimal pressure, the pressure causing the plurality of contact pins to urge the bottom surface of the pellicle frame against the top surface of the photomask with an optimal mounting force.

In another exemplary aspect, the present disclosure is directed to a pellicle mounting system. The system includes a mounting apparatus aligned with a top surface of a pellicle frame, the mounting apparatus having a continuous duct extending therethrough and a plurality of contact pins projecting from the mounting apparatus and engaging the top surface of the pellicle frame. The system also includes a pressurizing system coupled to the mounting apparatus and configured to introduce a pressurizing fluid into the continuous duct that causes each of the plurality of contact pins to engage the top surface of the pellicle frame with a substantially equal force, a combined force of the plurality of contact pins urging a bottom surface of the pellicle frame against a top surface of a photomask, the combined force being adjustable based on a pressure within the continuous duct. Further, the system includes a mounting control system communicatively coupled to the pressurizing system and configured to adjust the pressure within the continuous duct until the pressure is approximately equal to a pre-determined optimal pressure, the pressure causing the plurality of contact pins to urge the bottom surface of the pellicle frame against the top surface of the photomask with an optimal mounting force.

In yet another exemplary aspect, the present disclosure is directed to a pellicle mounting system. The system includes a mounting apparatus aligned with a top surface of a pellicle frame. The mounting apparatus includes a continuous duct extending therethrough, a plurality of contact pins projecting from the mounting apparatus and engaging the top surface of the pellicle frame, and a plurality of valves respectively associated with the plurality of contact pins, each valve in the plurality of valves being configured to control an amount of force a respective contact pin exerts on the top surface of the pellicle frame. The system also includes a pressurizing system coupled to the mounting apparatus and configured to introduce pressurizing fluid into the continuous duct and the plurality of valves, the pressurizing fluid causing the plurality of contact pins to engage the top surface of the pellicle frame and urge a bottom surface of the pellicle frame against a top surface of a photomask with a combined force, the combined force being adjustable in part by pressure within the continuous duct. Further, the method includes a mounting control system communicatively coupled to the pressurizing system and configured to adjust the pressure within the continuous duct until the pressure is approximately equal to a pre-determined optimal pressure, and the mounting control system being further configured to independently control each of the plurality valves to adjust the amount of force with which each respective contact pin exerts on the top surface of the pellicle frame.

What is claimed is:

1. A pellicle mounting method, comprising:
    aligning a mounting apparatus with a top surface of a pellicle frame, the mounting apparatus having a continuous duct extending therethrough and a plurality of contact pins projecting from the mounting apparatus and engaging the top surface of the pellicle frame;
    introducing a pressurizing fluid into the continuous duct that causes each of the plurality of contact pins to engage the top surface of the pellicle frame with a substantially equal force, a combined force of the plurality of contact pins urging a bottom surface of the pellicle frame against a top surface of a photomask, the combined force being adjustable based on a pressure within the continuous duct; and
    adjusting the pressure within the continuous duct until the pressure is approximately equal to a pre-determined optimal pressure, the pressure causing the plurality of contact pins to urge the bottom surface of the pellicle frame against the top surface of the photomask with an optimal mounting force;
    wherein the adjusting the pressure includes detecting a force exerted by the bottom surface of the pellicle frame against the top surface of the photomask and adjusting the pressure in response to the detecting so that the force exerted by the bottom surface of the pellicle frame against the top surface of the photomask is approximately equal to the optimal mounting force.

2. The pellicle mounting method of claim 1, prior to introducing the pressurizing fluid, aligning the bottom surface of the pellicle frame with the top surface of the photomask, an adhesive being disposed between the bottom surface of the pellicle frame and the top surface of the photomask.

3. The pellicle mounting method of claim 2, subsequent to the adjusting, maintaining the pressure within the continuous duct until the adhesive has secured the bottom surface of the pellicle frame to the top surface of the photomask.

4. The pellicle mounting method of claim 1,
wherein the mounting apparatus includes a plurality of valves respectively associated with the plurality of contact pins, each valve in the plurality of valves being configured to control an amount of force with which a respective contact pin exerts on the top surface of the pellicle frame; and
subsequent to adjusting the pressure within the continuous duct, adjusting at least one valve associated with an individual contact pin within the plurality of contact pins to adjust the amount of force the individual contact pin exerts on the top surface of the pellicle frame.

5. The pellicle mounting method of claim 1, wherein the pressurizing fluid is a gas.

6. The pellicle mounting method of claim 5, wherein the gas is clean, dry air.

7. The pellicle mounting method of claim 1, wherein the pressurizing fluid is a liquid.

8. The pellicle mounting method of claim 1, further including, prior to aligning the bottom surface of the pellicle frame with the top surface of the photomask, determining the pre-determined optimal pressure using a monitor photomask having a sensor thereon operable to detect a force exerted by the bottom surface of the pellicle frame against the top surface of the monitor photomask created by the combined force of the plurality of contact pins against the top surface of the pellicle frame.

9. The pellicle mounting method of claim 8, the determining including:
aligning the bottom surface of the pellicle frame with the top surface of the monitor photomask;
introducing the pressurized fluid into the continuous duct such that the plurality of contact pins engage the top surface of the pellicle frame and urge the bottom surface of the pellicle frame against the top surface of the monitor photomask;
detecting the force exerted by the bottom surface of the pellicle frame against the top surface of the monitor photomask with the sensor; adjusting, based on the detecting, the pressure within the continuous duct until the plurality of contact pins urge the bottom surface of the pellicle frame against the top surface of the photomask with the optimal mounting force; and
subsequent to the adjusting, setting the pre-determined optimal pressure equal to the adjusted pressure within continuous duct.

10. The pellicle mounting method of claim 1, further including, subsequent to the adjusting, fabricating a semiconductor device with at least a photolithography process that uses the photomask having the pellicle frame mounted thereto.

11. The pellicle mounting method of claim 1, further including, subsequent to the adjusting, passing radiation through the photomask and onto a semiconductor wafer to transfer a pattern on the photomask to the semiconductor wafer.

12. A pellicle mounting system, comprising:
a mounting apparatus aligned with a top surface of a pellicle frame, the mounting apparatus having a continuous duct extending therethrough and a plurality of contact pins projecting from the mounting apparatus and engaging the top surface of the pellicle frame;
a pressurizing system coupled to the mounting apparatus and configured to introduce a pressurizing fluid into the continuous duct that causes each of the plurality of contact pins to engage the top surface of the pellicle frame with a substantially equal force, a combined force of the plurality of contact pins urging a bottom surface of the pellicle frame against a top surface of a photomask, the combined force being adjustable based on a pressure within the continuous duct;
a mounting control system communicatively coupled to the pressurizing system and configured to adjust the pressure within the continuous duct until the pressure is approximately equal to a pre-determined optimal pressure, the pressure causing the plurality of contact pins to urge the bottom surface of the pellicle frame against the top surface of the photomask with an optimal mounting force; and
a monitor photomask having a sensor thereon operable to detect a force exerted by the bottom surface of the pellicle frame against a top surface of the monitor photomask.

13. The pellicle mounting system of claim 12, wherein the mounting control system is configured to receive force data from the sensor and determine the pre-determined optimal pressure within the continuous duct that causes the plurality of contact pins to urge the bottom surface of the pellicle frame against the top surface of the photomask with the optimal mounting force.

14. The pellicle mounting system of claim 12, wherein the mounting apparatus further includes a plurality of valves respectively associated with the plurality of contact pins, each valve in the plurality of valves being configured to control an amount of force with which a respective contact pin exerts on the top surface of the pellicle frame.

15. The pellicle mounting system of claim 14, wherein the mounting control system is further configured to control each valve in the plurality of valves to individually adjust an amount of force each individual contact pin exerts on the top surface of the pellicle frame.

16. The pellicle mounting system of claim 12, wherein the pressurizing fluid is a gas.

17. The pellicle mounting system of claim 16, wherein the gas is clean, dry air.

18. A pellicle mounting system, comprising:
a mounting apparatus aligned with a top surface of a pellicle frame, the mounting apparatus including:
a continuous duct extending therethrough;
a plurality of contact pins projecting from the mounting apparatus and engaging the top surface of the pellicle frame;
a plurality of valves respectively associated with the plurality of contact pins, each valve in the plurality of valves being configured to control an amount of force a respective contact pin exerts on the top surface of the pellicle frame;
a pressurizing system coupled to the mounting apparatus and configured to introduce pressurizing fluid into the continuous duct and the plurality of valves, the pressurizing fluid causing the plurality of contact pins to engage the top surface of the pellicle frame and urge a bottom surface of the pellicle frame against a top surface of a photomask with a combined force, the combined force being adjustable in part by pressure within the continuous duct; and
a mounting control system communicatively coupled to the pressurizing system and configured to adjust the pressure within the continuous duct until the pressure is approximately equal to a pre-determined optimal pressure, and the mounting control system being further configured to independently control each of the plurality valves to adjust the amount of force with which each respective contact pin exerts on the top surface of the pellicle frame.

19. The pellicle mounting system of claim 18, wherein the mounting apparatus further includes:
   a main inlet through which pressurizing fluid from the pressurizing system enters the continuous duct; and
   a plurality of contact pin inlets respectively associated with the plurality of contact pins through which pressurizing fluid from the pressurizing system respectively enters the plurality of valves.

20. The pellicle mounting system of claim 19, wherein each valve in the plurality of valves is configured to control the amount of pressure exerted on a respective contact pin in the plurality of contact pins by regulating the amount of pressurizing fluid from the continuous duct that influences the respective contact pin and also the amount of pressurizing fluid from a respective one of the plurality of contact pin inlets that influences the respective contact pin.

* * * * *